United States Patent
Hamaguchi

Patent Number: 5,825,695
Date of Patent: Oct. 20, 1998

[54] SEMICONDUCTOR DEVICE FOR REFERENCE VOLTAGE

[75] Inventor: Masanao Hamaguchi, Chiba, Japan

[73] Assignee: Seiko Instruments Inc., Japan

[21] Appl. No.: 626,158

[22] Filed: Apr. 4, 1996

[30] Foreign Application Priority Data

Apr. 5, 1995 [JP] Japan .................................. 7-080586
Feb. 2, 1996 [JP] Japan .................................. 8-017837

[51] Int. Cl.⁶ .................................................. G11C 7/00
[52] U.S. Cl. .................... 365/189.09; 365/226; 327/543
[58] Field of Search ........................... 365/189.09, 226; 327/543, 548, 538, 540

[56] References Cited

U.S. PATENT DOCUMENTS

| | | | |
|---|---|---|---|
| 5,283,762 | 2/1994 | Fujishima | 365/189.09 |
| 5,339,272 | 8/1994 | Tedrow et al. | 365/189.09 |
| 5,453,953 | 9/1995 | Dhong et al. | 365/189.09 |
| 5,461,591 | 10/1995 | Kim et al. | 327/548 |

*Primary Examiner*—Son T. Dinh
*Attorney, Agent, or Firm*—Adams & Wilks

[57] ABSTRACT

There is provided a semiconductor device for a reference voltage which has flat temperature characteristics and which generates a low reference voltage. A depression type MOS transistor 101 and an enhancement type MOS transistor 102 are each connected in series. A high voltage supply terminal 103 is provided at the drain of the depression type MOS transistor. A low voltage supply terminal 104 is provided at the source of the enhancement type MOS transistors. The gate of the depression type MOS transistor is connected to the low voltage supply terminal 104. The gate and drain of the enhancement type MOS transistor are connected. An output terminal 105 is provided at a point where both MOS transistors are connected. This provides flat temperature characteristics and allows the generation of a low reference voltage.

4 Claims, 1 Drawing Sheet

SEMICONDUCTOR DEVICE FOR REFERENCE VOLTAGE

BACKGROUND OF THE INVENTION

The present invention relates to a semiconductor device for a reference voltage wherein two or more MOS transistors of the same conductivity type having different threshold voltages are connected in series to generate a reference voltage, characterized in that it has flat temperature characteristics and it includes a means for generating a low reference voltage.

For example, a reference voltage circuit as shown in FIG. 2 has been conventionally used for generating a reference voltage in a MOS integrated circuit. This reference voltage circuit utilizes the constant current characteristic of a depletion type N-channel MOS transistor 201 and uses a voltage generated at an enhancement type N-channel MOS transistor 202 whose gate and drain are connected and which operates on the constant current as a reference voltage.

A MOS transistor satisfies Equation (1) when it is in a saturated state.

$$I = K(V_G - V_T)^2 \quad (1)$$

where I represents a current which flows between the source and drain; K represents a conduction coefficient; $V_G$ represents a voltage across the source and gate; and $V_T$ represents a threshold voltage.

Let us assume that $V_{TD}$ represents a threshold voltage of the depletion type N-channel MOS transistor 201 and $V_{TE}$ represents a threshold voltage of the enhancement type N-channel MOS transistor 202. Then, a current $I_D$ through the depletion type N-channel MOS transistor 201 and a current $I_E$ through the enhancement type N-channel MOS transistor 202 satisfy Equations (2) and (3).

$$I_D = K_D(V_{GD} - V_{TD})^2 \quad (2)$$

where $V_{GD}$ and $K_D$ respectively represent a voltage across the source and gate of the depletion type N-channel MOS transistor 201 and a conduction coefficient thereof.

$$I_E = K_E(V_{GE} - V_{TE})^2 \quad (3)$$

where $V_{GE}$ and $K_E$ respectively represent a voltage across the source and gate of the enhancement type N-channel MOS transistor 202 and a conduction coefficient thereof.

From $I_D = I_E$ and $V_{GD} = 0$ V, the constant source-gate voltage $V_{GE}$ to be obtained satisfies Equation (4).

$$V_{GE} = -(K_D/K_E)^{1/2} V_{TD} + V_{TE} \quad (4)$$

It is generally desirable that a reference voltage circuit has flat temperature characteristics. This can be achieved by making the conduction coefficient $K_D$ of the depletion type N-channel MOS transistor 201 and the conduction coefficient $K_E$ of the enhancement type N-channel MOS transistor 202 equal to each other. The constant source-gate voltage $V_{GE}$ at this time satisfies Equation (5).

$$V_{GE} = -V_{TD} + V_{TE} \quad (5)$$

A trend toward MOS integrated circuits operating on a low voltage requires reference voltage circuits used therein to be capable of generating a low reference voltage. In the prior art described with reference to FIG. 2, however, to obtain a reference voltage circuit having flat temperature characteristics, the reference voltage thereof must satisfy Equation (5) and is therefore determined by the difference between the threshold voltage $V_{TD}$ of the depletion type N-channel MOS transistor 201 and the threshold voltage $V_{TE}$ of the enhancement type N-channel MOS transistor 202. In order to decrease the reference voltage, it has been necessary to decrease the threshold voltage $V_{TD}$ of the depletion type N-channel MOS transistor 201 or the threshold voltage $V_{TE}$ of the enhancement type N-channel MOS transistor 202. There has been a problem in that a decrease in the threshold voltage of the integrated circuit as a whole results in an increase an off-leak current of the MOS transistors. A decrease in the threshold voltage of only the part of the reference voltage circuit has also resulted in a problem in that the manufacturing cost is increased because of increased masking steps involved.

SUMMARY OF THE INVENTION

An object of the present invention is to provide an improved semiconductor device for a reference voltage wherein the above-described problems with the prior art can be solved.

To solve the above-described problems, the present invention is characterized in that depletion type MOS transistors of the same conductivity type and at least one enhancement type MOS transistor are each connected in series; first voltage supply terminals are provided at the drains of the depletion type MOS transistors; a second voltage supply terminal is provided at the source of one of the enhancement type MOS transistors; the gates of the depletion type MOS transistors are connected to the second voltage supply terminal; the gate and drain of each of the enhancement type MOS transistors are connected; and an output terminal is provided at a point where the gate and drain of the enhancement type MOS transistor are connected.

The semiconductor device for a reference voltage having the above-described configuration can generate a reference voltage lower than the difference between a threshold voltage $V_{TD}$ of the depletion type MOS transistor and a threshold voltage $V_{TE}$ of the enhancement type MOS transistor even if a conduction coefficient $K_D$ of the depletion type MOS transistor and a conduction coefficient $K_E$ of the enhancement type MOS transistor are made equal to each other to make the temperature characteristics of the reference voltage circuit flat.

DETAILED DESCRIPTION OF THE INVENTION

An embodiment of the present invention will now be described with reference to FIG. 1.

Figure 1:
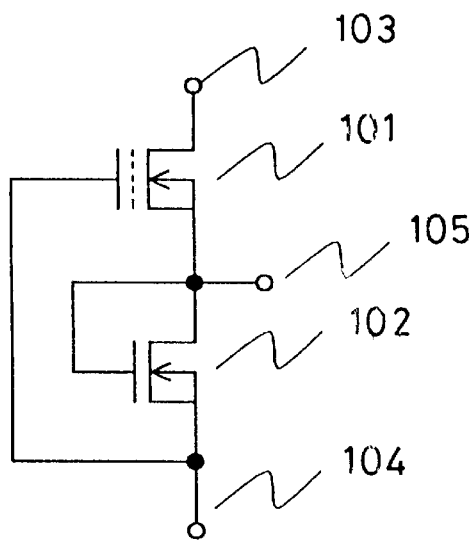
FIG. 1 is a circuit diagram showing an embodiment of a semiconductor device for a reference voltage according to the present invention.

In FIG. 1, MOS transistors satisfy the above Equation (1).

Let us assume that $V_{TD}$ represents a threshold voltage of a depletion type N-channel MOS transistor 101 and $V_{TE}$ represents a threshold voltage of an enhancement type N-channel MOS transistor 102. Then, a current $I_D$ through the depletion type N-channel MOS transistor 101 and a current $I_E$ through the enhancement type N-channel MOS transistor 102 satisfy Equations (6) and (7).

$$I_D = K_D(V_{GD} - V_{TD})^2 \qquad (6)$$

where $V_{GD}$ and $K_D$ respectively represent a voltage across the source and gate of the depletion type N-channel MOS transistor 101 and a conduction coefficient thereof.

$$I_E = K_E(V_{GE} - V_{TE})^2 \qquad (7)$$

where $V_{GE}$ and $K_E$ respectively represent a voltage across the source and gate of the enhancement type N-channel MOS transistor 102 and a conduction coefficient thereof.

From $I_D = I_E$ and $V_{GD} = -V_{GE}$, the constant source-gate voltage $V_{GE}$ to be obtained satisfies Equation (8).

$$V_{GE} = (-(K_D/K_E)^{1/2}V_{TD} + V_{TE})/((K_D/K_E)^{1/2} + 1) \qquad (8)$$

This means that it is possible to provide a reference voltage lower than the reference voltage available with the conventional reference voltage circuit as expressed by the above Equation (4) if the same transistor size and threshold voltages are used.

It is generally desirable that a reference voltage circuit has flat temperature characteristics. This can be achieved by making the conduction coefficient $K_D$ of the depletion type N-channel MOS transistor 101 and the conduction coefficient $K_E$ of the enhancement type N-channel MOS transistor 102 equal to each other. The constant source-gate voltage $V_{GE}$ at this time satisfies Equation (9).

$$V_{GE} = \frac{1}{2}(-V_{TD} + V_{TE}) \qquad (9)$$

This means that the source-gate voltage is decreased to one-half of that in the prior art when the temperature characteristics are made flat.

Figure 3:
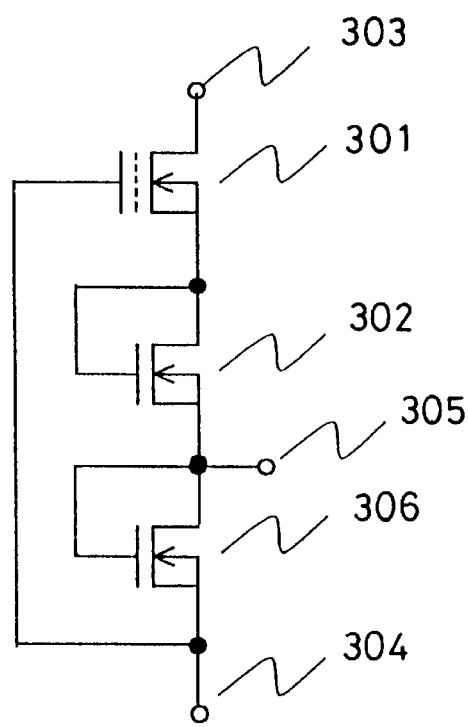
FIG. 3 is a circuit diagram showing a modification of the circuit shown in FIG. 1.
Figure 2:
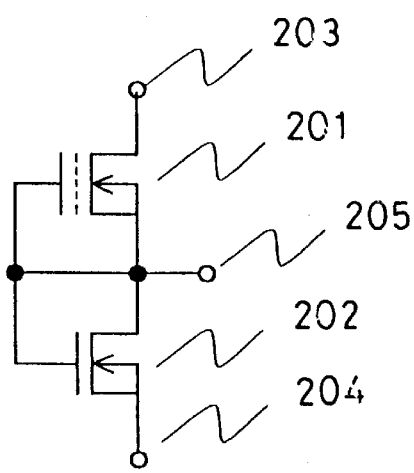
FIG. 2 is a circuit diagram of a conventional semiconductor device for a reference voltage.

FIG. 3 shows a modification of the semiconductor device for a reference voltage shown in FIG. 1.

In the semiconductor device for a reference voltage shown in FIG. 3, an enhancement type N-channel MOS transistor 306 whose gate and drain are connected is connected to a second voltage supply terminal 304 and a source of an enhancement type N-channel MOS transistor 302 in series.

In FIG. 3, the MOS transistors satisfy the above Equation (1) in a saturated state.

Let us assume that $V_{TD}$ represents a threshold voltage of a depletion type N-channel MOS transistor 301 and $V_{TE}$ represents threshold voltages of an enhancement type N-channel MOS transistor 302 and an enhancement type N-channel MOS transistor 306. Then, a current $I_D$ through the depletion type N-channel MOS transistor 301 satisfies Equation (10); a current $I_{E2}$ through the enhancement type N-channel MOS transistor 302 satisfies Equation (11); and a current $I_{E6}$ through the enhancement type N-channel MOS transistor 306 satisfies Equation (12).

$$I_D = K_D(V_{GD} - V_{TD})^2 \qquad (10)$$

where $V_{GD}$ and $K_D$ respectively represent a voltage across the source and gate of the depletion type N-channel MOS transistor 301 and a conduction coefficient thereof.

$$I_{E2} = K_{E2}(V_{GE2} - V_{TE})^2 \qquad (11)$$

where $V_{GE2}$ and $K_{E2}$ respectively represent a voltage across the source and gate of the enhancement type N-channel MOS transistor 302 and a conduction coefficient thereof.

$$I_{E6} = K_{E6}(V_{GE6} - V_{TE})^2 \qquad (12)$$

where $V_{GE6}$ and $K_{E6}$ respectively represent a voltage across the source and gate of the enhancement type N-channel MOS transistor 306 and a conduction coefficient thereof.

From $I_D = I_{E2} = I_{E6}$ and $V_{GD} = -V_{GE2} - V_{GE6}$, the constant source-gate voltage $V_{GE6}$ to be obtained satisfies Equation (13).

$$\begin{aligned} V_{GE6} = & \; (-(A - A \cdot B/(1+B))V_{TD} + \\ & (1 - A/(1+B))V_{TE})/ \\ & (1 + A - A \cdot B/(1+B)) \end{aligned} \qquad (13)$$

$A = (K_D/K_{E6})^{1/2}$
$B = (K_D/K_{E2})^{1/2}$

The temperature characteristics of the reference voltage circuit can be made flat by making the conduction coefficient $K_D$ of the depletion type N-channel MOS transistor 301, the conduction coefficient $K_{E2}$ of the enhancement type N-channel MOS transistor 302, and the conduction coefficient $K_{E6}$ of the enhancement type N-channel MOS transistor 306 equal to one another. The constant source-gate voltage $V_{GE6}$ at this time satisfies Equation (14).

$$V_{GE6} = \frac{1}{3}(-V_{TD} + V_{TE}) \qquad (14)$$

This means that the source-gate voltage is decreased to one-third of that in the prior art when the temperature characteristics are made flat.

Figure 4:
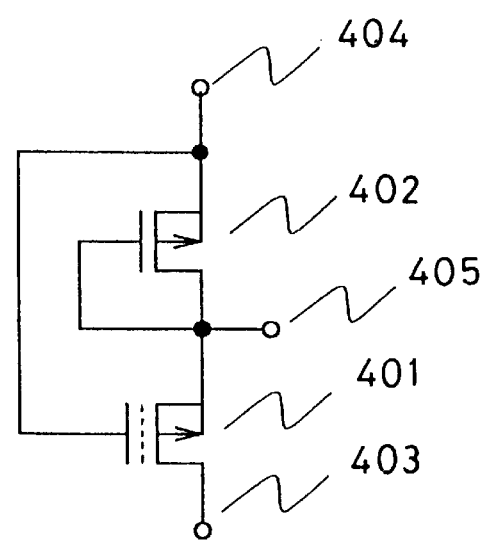
FIG. 4 is a circuit diagram showing a modification of the circuit shown in FIG. 1.

FIG. 4 shows a modification of the semiconductor device for a reference voltage shown in FIG. 1.

In FIG. 4, the MOS transistors satisfy the above Equation (1) in a saturated state.

Let us assume that $V_{TD}$ represents a threshold voltage of a depletion type P-channel MOS transistor 401 and $V_{TE}$ represents a threshold voltage of an enhancement type P-channel MOS transistor 402. Then, a current $I_D$ through the depletion type P-channel MOS transistor 401 and a current $I_E$ through the enhancement type P-channel MOS transistor 402 satisfy Equations (15) and (16).

$$I_D = K_D(V_{GD} - V_{TD})^2 \qquad (15)$$

where $V_{GD}$ and $K_D$ respectively represent a voltage across the source and gate of the depletion type P-channel MOS transistor 401 and a conduction coefficient thereof.

$$I_E = K_E(V_{GE} - V_{TE})^2 \qquad (16)$$

where $V_{GE}$ and $K_E$ respectively represent a voltage across the source and gate of the enhancement type P-channel MOS transistor 402 and a conduction coefficient thereof.

From $I_D = I_E$ and $V_{GD} = -V_{GE}$, the constant source-gate voltage $V_{GE}$ to be obtained satisfies Equation (17).

$$V_{GE} = (-(K_D/K_E)^{1/2}V_{TD} + V_{TE})/((K_D/K_E)^{1/2} + 1) \qquad (17)$$

It is generally desirable that a reference voltage circuit has flat temperature characteristics. This can be achieved by making the conduction coefficient $K_D$ of the depletion type P-channel MOS transistor 401 and the conduction coefficient $K_E$ of the enhancement type P-channel MOS transistor 402 equal to each other. The constant source-gate voltage $V_{GE}$ at this time satisfies Equation (18).

$$V_{GE} = \frac{1}{2}(-V_{TD} + V_{TE}) \qquad (18)$$

This means that a lower reference voltage can be obtained using P-channel MOS transistors as in the case wherein N-channel MOS transistors are used.

As described above, the present invention is advantageous in that a semiconductor device for a reference voltage which has flat temperature characteristics and which generates a low reference voltage can be provided at a low cost. In addition, when incorporated in a MOS integrated circuit, the present invention is effective in allowing the MOS integrated circuit to operate on a low voltage.

What is claimed:

1. A semiconductor device comprising:

a first depletion mode MOS field effect transistor comprising a first substrate having formed thereon a first gate electrode, a first source region and a first drain region, wherein the first drain region is connected to a first power terminal, the first source region is connected to the first substrate and the first gate electrode is connected to a second power terminal; a second MOS field effect transistor having a channel region with the same conductivity type as a channel region of the first depletion mode MOS transistor and comprising a second substrate having formed thereon a second gate electrode, a second source region and a second drain region, wherein the second gate electrode is connected to the second drain region and the second source region is connected to the second substrate and the second power terminal; wherein the first and second transistors are connected in series.

2. A semiconductor device according to claim 1; further comprising a third MOS field effect transistor having a channel region with the same conductivity type as a channel region of the second transistor and comprising a third substrate having formed thereon a third gate electrode, a third source region and a third drain region, wherein the third gate electrode is connected to the third drain region and the third source region is connected to the third substrate; and wherein the first, second and third transistors are connected in series.

3. A semiconductor device for generating a reference voltage, comprising: a depletion mode MOS transistor; at least one enhancement mode MOS transistor connected in series to the depletion mode MOS transistor, the at least one enhancement mode MOS transistor having a channel region with the same conductivity type as a channel region of the depletion mode MOS transistor; a first voltage supply terminal provided at a drain region of the depletion mode MOS transistor; a second voltage supply terminal provided at a source region of one of the at least one enhancement mode MOS transistor; and an output terminal; wherein a gate electrode of the depletion mode MOS transistor is connected to the second voltage supply terminal, the gate electrode and drain region of each of the at least one enhancement type MOS transistor are connected to each other, and the output terminal is provided at a point where the gate electrode and drain region of an enhancement mode MOS transistor are connected.

4. A semiconductor device for generating a reference voltage, comprising: a depletion mode MOS transistor; at least one enhancement mode MOS transistor connected in series to the depletion mode MOS transistor, the at least one enhancement mode MOS transistor having a channel region with the same conductivity type as a channel region of the depletion mode MOS transistor and having conduction coefficients substantially equal to those of the depletion mode MOS transistor; a first voltage supply terminal provided at a drain region of the depletion mode MOS transistor; a second voltage supply terminal provided at a source region of an enhancement mode MOS transistor; and an output terminal; wherein a gate electrode of the depletion mode MOS transistor is connected to the second voltage supply terminal, the gate electrode and drain region of the at least one enhancement mode MOS transistor are connected to each other, and the output terminal is provided at a point where the gate electrode and drain region of the at least one enhancement mode MOS transistor are connected.

* * * * *